(12) United States Patent
Kokubo et al.

(10) Patent No.: US 6,806,738 B2
(45) Date of Patent: Oct. 19, 2004

(54) SEMICONDUCTOR CIRCUIT DEVICE CAPABLE OF HIGH SPEED DECODING

(75) Inventors: Nobuyuki Kokubo, Hyogo (JP); Akira Hosogane, Hyogo (JP); Hidemoto Tomita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/442,132

(22) Filed: May 21, 2003

(65) Prior Publication Data

US 2004/0100305 A1 May 27, 2004

(30) Foreign Application Priority Data

Nov. 27, 2002 (JP) ........................................ 2002-344174

(51) Int. Cl.[7] .............................................. H03K 19/00
(52) U.S. Cl. ............................ 326/101; 326/15; 326/21
(58) Field of Search .............................. 326/15, 21, 22, 326/101, 105

(56) References Cited

U.S. PATENT DOCUMENTS 6,097,209 A * 8/2000 Fujimoto ..................... 326/27
6,285,208 B1 * 9/2001 Ohkubo ...................... 326/15

FOREIGN PATENT DOCUMENTS

| JP | 07-307448 | 11/1995 |
| JP | 08-321590 | 12/1996 |

* cited by examiner

*Primary Examiner*—Anh Q. Tran
(74) *Attorney, Agent, or Firm*—McDermott Will & Emery LLP

(57) ABSTRACT

An address signal is transferred from an address bus transmitting an address from an address generation circuit, to a real address bus connecting to a decoder for decoding an applied address signal, via a branch node, a branch address bus and contacts. The real address bus and the branch address bus are electrically connected at a plurality of points using the contacts. The branch address bus functions as a lining or backing signal line to the real address bus, and a line resistance and line capacitance of the real address bus can be equivalently reduced. A variation in signal propagation delay over an entire decoding circuits is suppressed.

6 Claims, 9 Drawing Sheets

NG

SEMICONDUCTOR CIRCUIT DEVICE CAPABLE OF HIGH SPEED DECODING

BACKGROUND OF THE INVENTION

1. Field of the Invention

The present invention relates to a semiconductor circuit device and, specifically, to a semiconductor circuit device for decoding a plurality of signals to generate a signal selecting a selection object element. More specifically, the present invention relates to a construction for speeding up a decoding circuit for decoding a plurality of address signals.

2. Description of the Background Art

In a semiconductor device, a circuit is widely used which selects one of a plurality of object circuits or elements according to a selection signal. A typical example of such a selection circuit is an address decoding circuit, which generates a signal for selecting data in an addressed storage location according to an address signal in a semiconductor memory device.

In a SRAM (Static Random Access Memory), a DRAM (Dynamic Random Access Memory), a non-volatile memory or other memory, memory cells are arranged in rows and columns. Generally, in accessing data, a row and a column of a memory cell are selected according to an address signal, to select a memory cell at the addressed location, and data is written to or read from the selected memory cell.

Unit address decoding circuits are arranged corresponding to rows and columns of memory cells, to select a memory cell. Here, structures of a memory block, a memory bank and others are not considered. The most simple memory cell array structure is considered, for simplicity of description. A pre-assigned set of address signals are applied to each of the unit address decoding circuit. The unit address decoding circuit corresponding to an addressed row or column is selected, and a selection signal for the corresponding row or column is activated.

The unit address decoding circuits in such an address decoding circuit have the same structure. Thus, circuits of the same structure are repeatedly arranged corresponding to memory cell rows or columns. A combination of address signals is different for different decoding circuit. A layout is simplified by repeatedly arranging circuits of the same structure. As the same patterns are repeatedly arranged, patterning of the circuits becomes accurate and easy, which results in the same circuit operation characteristics.

In a semiconductor memory device, a data access is needed to be made as fast as possible. To achieve such a high-speed access, it is required to decode an address signal and drive the addressed row or column to a selection state as quickly as possible. A word line shunt structure, in which a word line is lined by a metal interconnection line of an upper layer, is used, in some cases, to quickly drive the word line arranged corresponding to a memory cell row to a selection state. Examples of such a word line shunt structure are shown in a prior art reference 1 (Japanese Patent Laying-Open No. 8-321590) and a prior art reference 2 (Japanese Patent Laying-Open No. 7-307446). By electrically connecting a word line formed of polysilicon (polycrystalline silicon) or the like of a relatively high resistance with a metal interconnection line of a low resistance, the resistance of the word line is equivalently reduced, and a word line drive signal (or a word line selection signal) is transmitted from a proximal end to a distal end of the word line at high speed.

To select a memory cell at high speed, it is required to perform an address decoding operation as well at high speed.

In regard to an address signal, as a unit decoding circuit is arranged corresponding to each memory cell row or column, a large number of decoding circuits are connected to an address signal line, which results in the large load on the address signal line. In addition, as the address signal line is arranged in common to the large number of decoding circuits, the interconnection becomes longer. Therefore, a line capacitance and a resistance of the address signal, or an RC time constant become greater, and thus the address signal cannot be switched at high speed, resulting in a longer access cycle time. Particularly, when the address signal statically changes as in a static random access memory (SRAM), this delay in the change of the address signal significantly affects an operation cycle time.

In addition, because of a signal propagation delay due to a capacitance and a resistance of the address signal line, arrival times of address signals at decoding circuits differ between a proximal end and a distal end of the address signal line, and accordingly, actual decoding operation start timings of unit decoding circuits differ. Therefore, definition timings of the decoding results of the address signals are different depending on positions of the unit decoding circuits, and as an operation start timing of a subsequent circuit such as a word line drive circuit is determined based on an output signal of the unit decoding circuit of the worst case, the high-speed access cannot be achieved.

Furthermore, when the operation timing of the subsequent circuit is made as fast as possible, a margin of the subsequent circuit to the worst case circuit is reduced, and an accurate operation cannot be ensured.

Such a decrease in operation speed due to increased load of the signal line typically appears in an address signal in a semiconductor memory device. In other decoding circuit which generates a signal of generating a selection signal or designating an operation mode according to a control signal as well, however, generally a large number of circuits of the same structure (repetitive circuits) are connected to a single signal line, and thus the load of the signal line becomes greater and the signal line cannot be driven at high speed.

The above-descirbed prior art reference 1 discloses a structure, in which both ends of each of word lines arranged on symmetrical positions of two memory arrays are connected by metal lining interconnection lines in a mask ROM (Read Only Memory). This reference 1, however, does not consider speeding up of a decoding circuit itself which drives the word line and the disadvantage of the address signal load at all. Although reduced resistance of a whole word line through lining (backing) by metal interconnection is described, the problem of distribution of the signal propagation delay on a single word line is not considered.

In the above-descirbed prior art reference 2, lining metal interconnection segments are discretely arranged for one word line such that the lining metal interconnection segments in adjacent word lines are arranged on different positions. With the discrete arrangement, it is intended to decrease a pitch of the lining metal interconnection in a column direction, and correspondingly, to decrease a pitch of the word lines. In this structure, however, regions lined and not lined by the metal interconnection exist in a single word line, and signal propagation delays distributes over one word line. Therefore, in the structure of the prior art reference 2, the portion of the high-resistance, lower-layer word line which is not lined exerts a significant effect, and thus the whole word line cannot be driven to a selected state at high speed.

In the prior art reference 2, there also is no discussion on implementing a faster decoding operation timing by changing an address signal at high speed in a circuit of decoding the address signal, and the problem of the address signal propagation delay is not considered at all.

SUMMARY OF THE INVENTION

An object of the present invention is to provide a semiconductor circuit device that can transfer a signal to be decoded to a distal end of a signal line at high speed.

Another object of the present invention is to provide a semiconductor circuit device that can sufficiently decrease a difference in signal arrival times at decoding circuits.

A semiconductor circuit device according to the present invention includes a plurality of first interconnection lines respectively arranged corresponding to a plurality of signals, a plurality of second interconnection lines respectively arranged corresponding to and in parallel with the first interconnection lines, each second interconnection line being electrically connected to a corresponding first interconnection line at a prescribed position and transmitting a corresponding signal to the corresponding first interconnection line, and a plurality of logic circuits formed in a lower layer region below the first interconnection lines, each logic circuit receiving a signal of a predetermined interconnection line of the plurality of first interconnection lines and logically processing the received signal to generate an output signal.

A first interconnection line is connected with a plurality of logic circuits and is accompanied with the large load and the large signal propagation delay. On the other hand, a second interconnection line is not connected to a logic circuit and can transmit the signal at high speed. By electrically connecting the first and second interconnection lines at a prescribed position, a signal can be transmitted to a distal end of the first interconnection line through the second interconnection line, and accordingly, an RC delay due to a resistance and a capacitance of the first interconnection line can equivalently decrease. Thus, a variation in signal propagation delay of the first interconnection lines among the logic circuits can be decreased, and the signal can quickly be changed to perform an actual decoding operation at a faster timing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
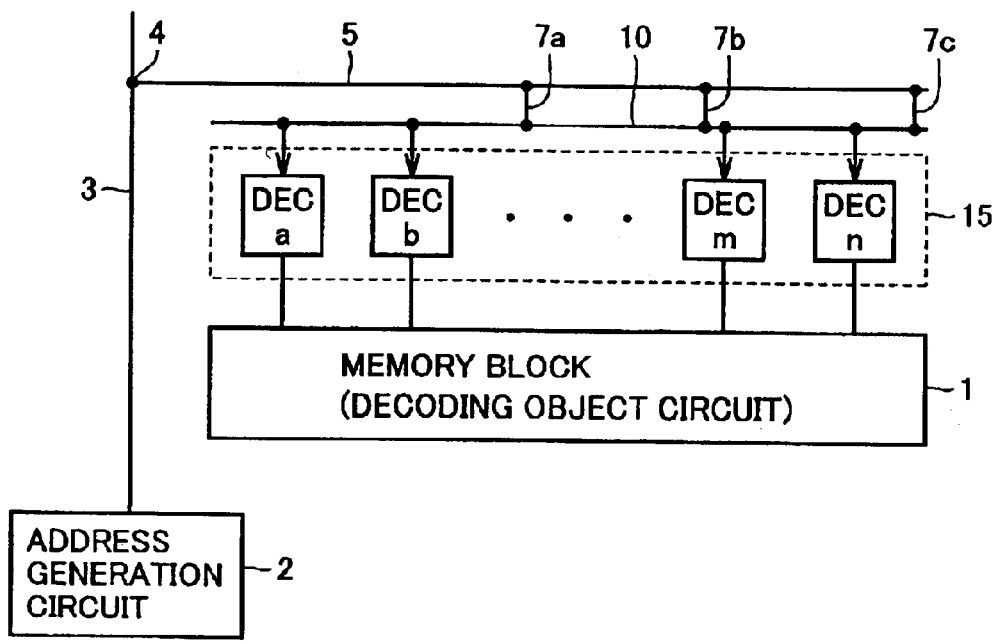
FIG. 1 schematically shows a structure of a semiconductor circuit device according to a first embodiment of the present invention.

FIG. 1 schematically shows a structure of a semiconductor circuit device according to a first embodiment of the present invention. In FIG. 1, the semiconductor circuit device includes a memory block 1 or a decoding object circuit including decoding object elements, an address generation circuit 2 for generating an address specifying a data storage location of memory block 1, an address bus 3 transmitting an address signal from address generation circuit 2, a branch address bus 5 connected to address bus 3 at branch node 4 and transmitting the address signal from address generation circuit 2, a real address bus 10 electrically connected to branch address bus 5 at prescribed positions through connecting (interconnection) lines 7a to 7c and transmitting the address signal, and an address decoding circuit 15 for decoding the address signal on real address bus 10 and selecting an addressed storage location of memory block 1.

Address decoding circuit 15 includes decoders DECa to DECn each for decoding a prescribed set of bits of the address signal on real address bus 10. A storage location formed by a memory cell of one bit or several bits in memory block 1 is specified according to the address signal on real address bus 10, and the addressed storage location is selected by decoders DECa to DECn.

Memory cells are arranged in rows and columns in memory block 1, and address decoding circuit 15 may be a row address decoding circuit selecting a memory cell row in memory block 1 or a column address decoding circuit selecting a memory cell column in memory block 1.

Decoders DECa to DECn have the same structure and receive different combinations of address signal bits. When the received address signal bits correspond to a pre-assigned address, decoders DECa to DECn drive outputs thereof to a selected state.

As shown in FIG. 1, decoders DECa to DECn are directly connected to real address bus (first interconnection) 10, while branch address bus (second interconnection line) 5 is connected merely to real address bus 10 via contacts 7a to 7c. Therefore, branch address bus 5 is smaller in load smaller than real address bus 10, and can transmit the address signal, transmitted from address generation circuit 2 over address bus 3, from branch node 4 to a distal end thereof at high speed.

Connecting lines 7a to 7c are each formed of a low to resistance conductive material and electrically connect branch address bus 5 and the real address bus. Through the connecting lines, the address signal on branch address bus 5 is transmitted to real address bus 10, and the load of real address bus 10 is equivalently decreased to enable high-speed transmission of the address signal to decoders DECa to DECn of address decoding circuit 15 to decrease a difference in arrival time of the address signal at decoders DECa to DECn. Thus, the address signal can be transferred over the whole address decoding circuit 15 at high speed by using branch address bus 5 as a lining or backing interconnection to real address bus 10.

Figure 2:
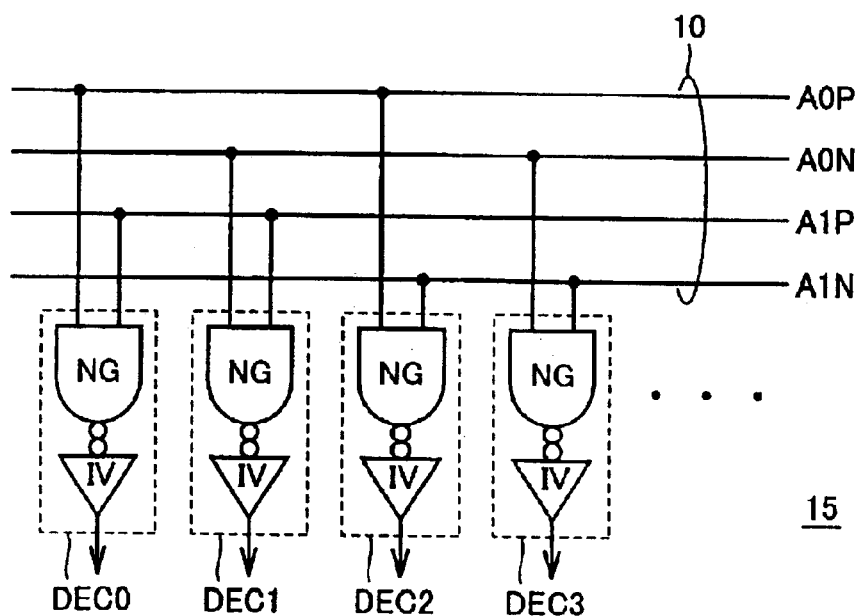
FIG. 2 shows an example of a structure of an address decoding circuit shown in FIG. 1.

FIG. 2 shows an example of a structure of address decoding circuit 15 shown in FIG. 1. In FIG. 2, a circuit for decoding a 4-bit address A0P, A0N, A1P, and A1N is shown as an example. Address bits A0P and A0N are complementary address bits generated from an address signal A0, while bits A1P and A1N are complementary address bits generated from an address signal A1.

Address decoding circuit 15 includes decoders DEC0 to DEC3 as unit decoding circuits. Decoders DEC0 to DEC3 have the same structure, and each includes an NAND gate NG and an inverter IV inverting an output signal of NAND gate NG to generate a decoding signal. A signal indicating a decoding result is generated from inverter IV and applied to a word line drive circuit, a column selection gate or similar circuit in memory block 1.

One bit of address bits A0P and A0N and one bit of address bits A1P and A1N are supplied to each of decoders DEC0 to DEC3. One of decoders DEC0 to DEC3 is selected by the 4-bit address A0P, A0N, A1P, and A1N.

In address decoding circuit 15, a large number of decoders (unit decoding circuits) having the same structure are arranged, depending on the number of address bits. Thus, input load capacitances of the large number of decoders are connected to the address signal line transmitting each address bit. In addition, as the signal is transferred to the large number of decoders, the interconnection line becomes longer. Therefore, an interconnection line capacitance and an interconnection line resistance of the address signal line of the real address bus is increased, and accordingly the signal propagation delay increases. The signal propagation delay and a propagation delay distribution are suppressed by using branch address bus 5 shown in FIG. 1 as a lining (backing) line.

Figure 3:
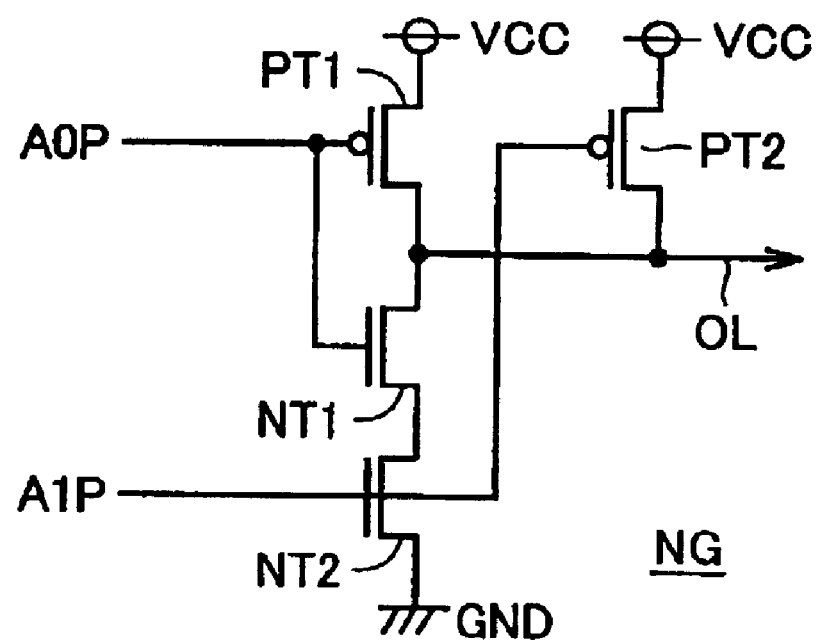
FIG. 3 shows an example of a structure of an NAND gate shown in FIG. 2.

FIG. 3 shows an example of a structure of NAND gate NG included in one of decoders DEC0 to DEC3 shown in FIG. 2. In FIG. 3, NAND gate NG included in decoder DEC0 is representatively shown. This NAND gate NG receives address bits A0P and A1P. Each of NAND gates NGs in the other decoders DEC1 to DEC3 has the same structure except for a combination of address bits applied thereto.

In FIG. 3, NAND gate NG includes a P channel MIS transistor (insulated gate field effect transistor) PT1 connected between a power node and an output line OL and receiving address bit A0P at a gate thereof, a P channel MIS transistor PT2 connected between a power node and output line OL and receiving address bit A1P at a gate thereof, and N channel MIS transistors NT1 and NT2 connected between output line OL and a ground node in series. Address bits A0P and A1P are respectively applied to the gates of MIS transistors NT1 and NT2.

In NAND gate NG shown in FIG. 3, when both address bits A0 and A1P are at the H level (logical high level), both MIS transistors PT1 and PT2 are set to a non-conductive state while both MIS transistors NT1 and NT2 are set to a conductive state, and output line OL is discharged to a ground voltage GND level.

When at least one of address bits A0P and A1P is at the L level (logical low level), at least one of MIS transistors NT1 and NT2 is set to a non-conductive state, and a discharging path of output line OL is cut off. In addition, at least one of MIS transistors PT1 and PT2 is set to a conductive state, and output line OL is driven to a power supply voltage Vcc level.

NAND gate NG has output line OL driven to ground voltage GND level when selected, and a corresponding decoder output is driven to the H level by subsequent inverter IV.

The number of components, that is, MIS transistors in NAND gate NG is set depending on the number of applied address bits.

Figure 4:
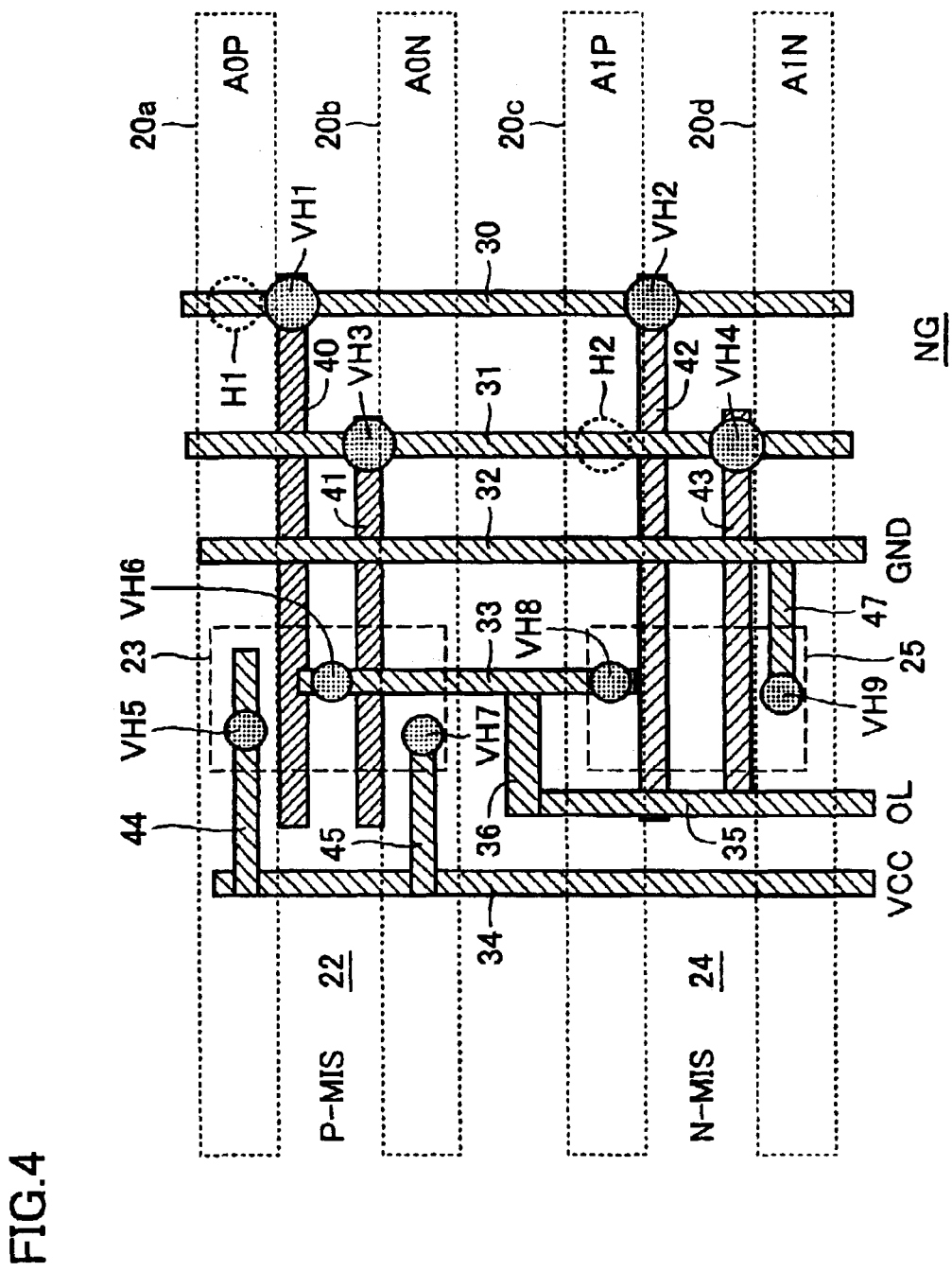
FIG. 4 schematically shows a planar layout of the NAND gate shown in FIG. 3.

FIG. 4 schematically shows an example of a interconnection layout of the NAND gate shown in FIG. 3. In FIG. 4, first interconnection lines 20a to 20d respectively transmitting address bits A0P, A0N, A1P, and A1N are arranged extending in a horizontal direction of the drawing with a prescribed spacing. Each of first interconnection lines 20a to 20d is formed of a first metal interconnection line, for example, and is provided in common to a plurality of decoders included in the address decoding circuit.

A transistor arrangement region 22, in which the P channel MIS transistors are arranged, is provided in a region below an arrangement region for first interconnection lines 20a and 20b. A transistor arrangement region 24, in which the N channel MIS transistors are arranged, is provided in a region below an arrangement region for first interconnection lines 20c and 20d. Active regions 23 and 25, in which the transistors are formed, are provided in respective. transistor arrangement regions 22 and 24.

Active region 23 includes a P type impurity region (diffusion layer) formed in a surface of an N type substrate (not shown), and P channel MIS transistors PT1 and PT2 shown in FIG. 3 are formed. Active region 25 includes an N type impurity region (diffusion layer) formed in a surface of a P type substrate, which is not shown, and N channel MIS transistors NT1 and NT2 shown in FIG. 3 are formed. Active regions 23 and 25 are formed respectively in transistor arrangement regions 22 and 24 with a prescribed spacing. A layout area of the transistor arrangement region is reduced by forming two transistors in each of active regions 23 and 25.

Internal interconnection lines 30 to 34 formed of second polysilicon interconnection lines, for example, are arranged crossing first interconnection lines 20a to 20d. Internal interconnection line 30 is connected to first interconnection line 20a via a through hole H1, while internal interconnection line 31 is connected to first interconnection line 20c via a through hole H2. Internal interconnection lines 32 and 34 transmit ground voltage GND and power supply voltage VCC, respectively. Internal interconnection line 33 is electrically connected to active regions 23 and 25 via contacts VH6 and VH8, respectively. Internal interconnection line 33 is connected to an internal interconnection line 35, which extends in parallel to internal interconnection line 34, via an internal interconnection line 36 extending in a horizontal direction in the drawing. Internal interconnection line 35 forms output line OL shown in FIG. 3.

Internal interconnection 34 is connected to active region 23 via interconnection lines 44 and 45 extending to active region 23 in a horizontal direction and contacts VH5 and VH7. With this, power supply voltage VCC is supplied to the P channel MIS transistor connected to active region 23. Internal interconnection 32 is connected to active region 25 via an interconnection 47 extending to active region 25 in a horizontal direction in the drawing and a contact VH9. Ground voltage GND is supplied to a source of the N channel MIS transistor formed in active region 25.

Gate electrode interconnection lines 40 and 42 formed with first polysilicon, for example, are formed crossing active region 23 in a horizontal direction in the drawing with contact VH6 interposed in between. Gate electrode interconnection line 40 is electrically connected to internal interconnection line 30 by a via hole VH1, while gate electrode interconnection line 41 is electrically connected to internal interconnection line 31 by a via hole VH3. Address bits A0P and A1P are applied to the gates of the P channel MIS transistors formed in active region 23 via internal interconnection lines 30 and 31.

Gate electrode interconnection lines 42 and 43 are arranged crossing active region 25 with a prescribed spacing. Gate electrode interconnection line 42 is connected to internal interconnection line 30 by a via hole VH2, while gate electrode interconnection line 43 is electrically connected to internal interconnection line 31 by a via hole VH4. With these via holes VH2 and VH4, address bits A0P and A1P are applied from internal interconnection lines 30 and 31 to the gates of the N channel MIS transistors formed in active region 25, respectively.

In the layout shown in FIG. 4, when the number of address bits increases, internal interconnection lines 32 and 34 transmitting power supply voltage VCC and ground voltage GND are arranged continuously extending in a vertical direction in the drawing in common to transistors formed corresponding to the address bits. Similarly, the internal interconnection line forming output line OL is formed continuously extending in a vertical direction in FIG. 4. Internal interconnection lines 30 and 31 are arranged only in regions corresponding to transistor formation regions 22 and 24. For each additional address bit of an increased number of address bits, a transistor formation region in which P channel MIS transistors are arranged and a transistor arrangement region in which N channel MIS transistors are formed are similarly arranged, and a layout similar to that shown in FIG. 4 is arranged corresponding to the other address bits.

Therefore, in the structure shown in FIG. 4, internal interconnection lines 30 and 31 are arranged only in transistor regions corresponding to address signals A0 (bits A0P, A0N) and A1 (bits A1P, A1N). Gate electrode interconnection lines 40 to 43, however, are arranged extending in a horizontal direction in FIG. 4 over relatively long distances for connection with internal interconnection lines 30 and 31. Therefore, parasitic capacitances, as well as high resistances, are formed for first interconnection lines 20a to 20d, which causes the signal propagation delay.

Other decoders are arranged in transistor formation regions 22 and 24 with the layouts similar to that shown in FIG. 4.

Figure 5:
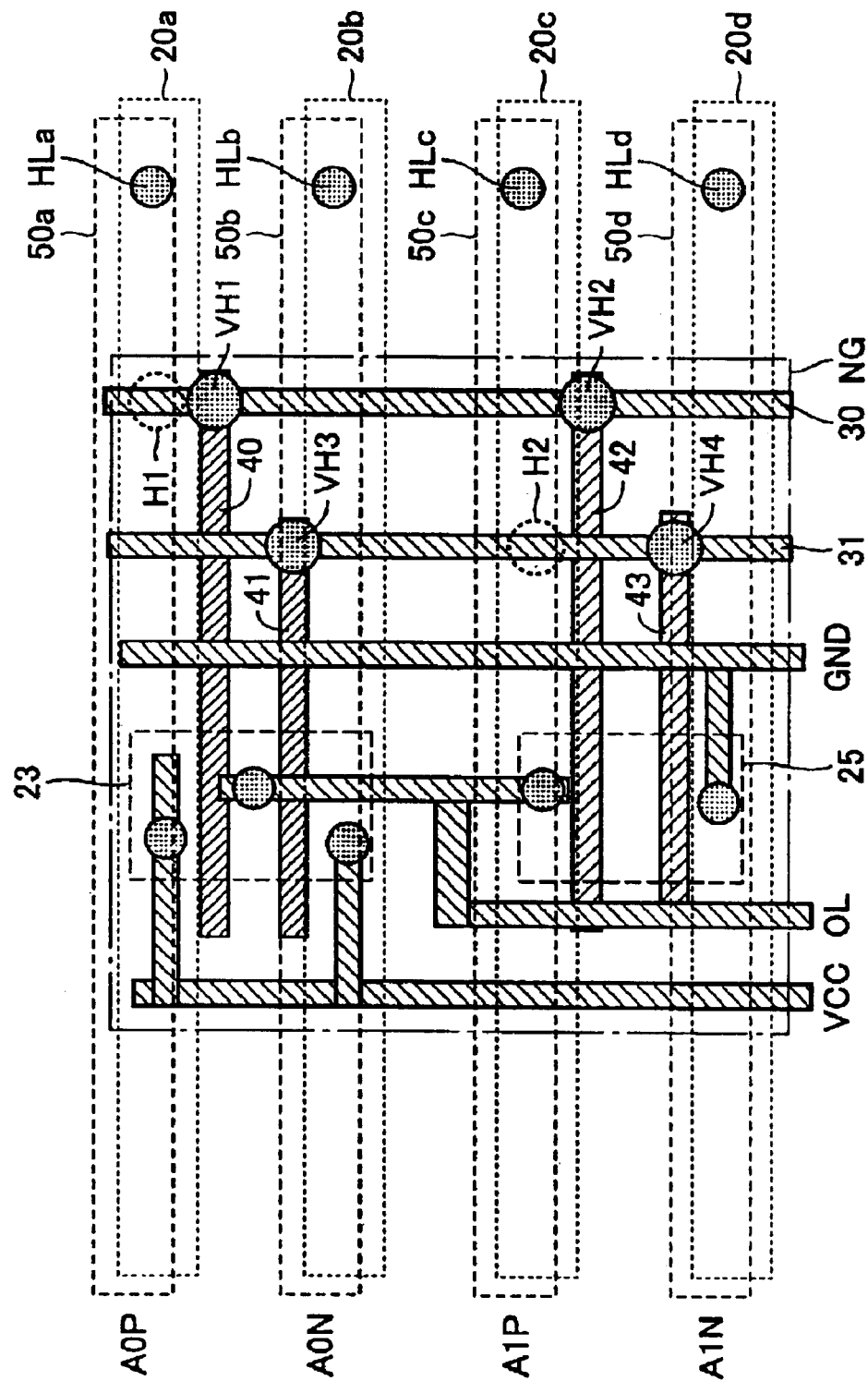
FIG. 5 schematically shows an interconnection layout in the first embodiment of the present invention.

FIG. 5 schematically shows an interconnection layout of the semiconductor circuit device according to the first embodiment of the present invention. FIG. 5 also shows the structure of a portion arranged corresponding to NAND gate NG shown in FIG. 4. NAND gate NG has the same layout as the NAND gate shown in FIG. 4. Specifically, two MIS transistors are formed in each of active regions 23 and 25 to decode address bits A0P, A0N, A1P, and A1N.

In the arrangement shown in FIG. 5, low to resistance second interconnection lines 50a to 50d formed of second metal interconnection lines, for example, are arranged in parallel with first interconnection lines 20a to 20d. Second interconnection lines 50a to 50d are electrically connected to first interconnection lines 20a to 20d respectively via through holes HLa to HLd. In FIG. 5, first interconnection lines 20a to 20d are shown being displaced from second interconnection lines 50a to 50d, respectively. This, however, is only to explicitly show the structure of transmitting address bits A0P, A0N, A1P, and A1N by a multilayer structure of first interconnection lines 20a to 20d and second interconnection lines 50a to 50d. Second interconnection lines 50a to 50d are arranged aligned in parallel and overlapping with respective first interconnection lines 20a to 20d in a two-dimensional layout.

First interconnection line 20a is connected to internal interconnection line 30 via through hole H1, while first interconnection line 20c is connected to internal interconnection line 31 via through hole H2. Similarly to the layout shown in FIG. 4, internal interconnection 30 is connected to gate electrode interconnection lines 40 and 42 respectively by via holes VH1 and VH2, while internal interconnection line 31 is connected to gate electrode interconnection lines 41 and 43 respectively by via holes VH3 and VH4.

Therefore, the internal interconnection line and the gate electrode interconnection line are not connected to second interconnection lines 50a to 50d. Thus, second interconnection lines 50a to 50d are each small in line resistances and line capacitances, and can transmit corresponding address bits A0P, A0N, A1P, and A1N to distal ends thereof at high speed. Accordingly, the signal propagation delay due to line resistances and line capacitances of first interconnection lines 20a to 20d can equivalently be reduced, resulting in high-speed transmission of address bits to distal ends of first interconnection lines 20a to 20d.

In addition, in contrast to the structure of the previously described reference 2, a permissible line width of an upper layer interconnection line does not limit a pitch condition of a lower layer interconnection by forming first interconnection lines 20a to 20d and second interconnection lines 50a to 50d with the same interconnection material. Therefore, the first and second interconnection lines can be arranged with an allowable minimum pitch, which can suppress an increase in interconnection layout area.

Figure 6:
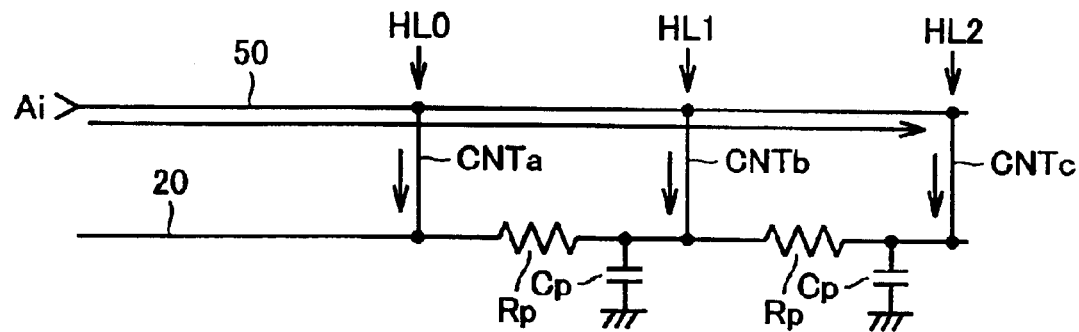
FIG. 6 shows an electrical equivalent circuit of a first interconnection line and a second interconnection line of the interconnection layout shown in FIG. 5.

FIG. 6 schematically shows an electrical equivalent circuit of a connection of the first interconnection line and the second interconnection line in the first embodiment of the present invention. A first interconnection line 20 and a second interconnection line 50 are representatively shown in FIG. 6. First interconnection line 20 and second interconnection line 50 are electrically connected by conductive members CNTa, CNTb and CNTc, which correspond to contacts 7a to 7c shown in FIG. 1, at through holes HL0, HL1 and HL2 arranged at a prescribed spacing. An address bit Ai from address generation circuit 2 shown in FIG. 1 is transmitted over second interconnection line 50.

As shown in FIGS. 4 and 5, resistances and capacitances of gate electrode interconnection lines 40 to 43 and internal interconnection lines 30 and 31 are connected to first interconnection line 20. In FIG. 6, a state is illustrated, in which a line resistance Rp and a line capacitance Cp exist on first interconnection line 20 in each of regions between through holes HL0 and HL1 and between through holes HL1 and HL2. Address bit Ai is only transmitted to second interconnection line 50, and it can be regarded that a line resistance and a parasitic capacitance of second interconnection line 50 are negligible as compared with those of first interconnection line 20.

As shown in FIG. 6, in second interconnection line 50, address bit Ai is transmitted at high speed to through hole HL2 at the distal end. In first interconnection line 20, on the other hand, address bit Ai is transmitted via conductive members CNTa and CNTb at through holes HL0 and HL1, and also via conductive members CNTc at through hole HL2. Therefore, in first interconnection line 20, address bit Ai can be transferred to each portion of first interconnection line 20 more quickly as compared with the situation in which address bit Ai is successively transferred via line resistance Rp and line capacitance Cp, and therefore, address bit Ai can be transferred to the distal end portion of first interconnection line 20 at high speed.

Further, in this arrangement, the signal propagation delay at each portion of first interconnection line 20 can be further reduced because address bit Ai is transmitted from opposite sides in each of the regions between through holes HL0 and HL1 and between through holes HL1 and HL2 in first interconnection line 20. Therefore, arrival times of the address bit can be made highly uniform in a region formed by through holes HL0 to HL2 in first interconnection line 20.

In a proximal end region from the proximal end of first interconnection line 20 to through hole HL0, address bit Ai is transmitted from through hole HL0 to the proximal end portion. Therefore, when a line resistance and a parasitic capacitance similarly exist in the proximal end region of first interconnection line 20, address bit Ai is transmitted with a time constant determined by the line resistance and parasitic capacitance of the proximal end region. In the proximal end region, when there is a signal propagation delay on second interconnection line 50, the signal arrival times in the first interconnection line 20 can be made more uniform by transferring the address bit from through hole HL0 as compared with a case in which the address bit is transferred also from the proximal end, and a difference in arrival time of the signal (address bit) over an entirety of first interconnection line 20 can be sufficiently reduced. The signal propagation delay in the proximal end region of first interconnection line 20 will be described later in detail.

Even when first interconnection line 20 and second interconnection line 50 are formed of metal interconnection lines of the same material, the metal interconnection line of an. upper layer is generally more excellent in electric characteristics than a lower layer metal interconnection line. This is because the interconnection line formed in the lower layer is doped with an impurity to increase the strength to improve stress resistance. Therefore, even when first interconnection line 20 and second interconnection line 50 are metal interconnection lines formed with the same material (copper or aluminum interconnection lines, for example), second interconnection line 50 are more excellent in electric characteristics than first interconnection line 20, when second interconnection line 50 is formed in an upper layer above first interconnection line 20. Consequently, address bit Ai can be transmitted to each portion of first interconnection line 20 at high speed.

In particular, address bit Ai is transmitted from second interconnection line 50 to the proximal end region of first interconnection line 20 via through hole HL0, and a driver transmitting address bit Ai is not coupled to the proximal end of first interconnection line 20. Arrangement positions of through holes HL0 to HL2 are determined so as to satisfy a prescribed condition described later. According to such arrangement, an effect of the signal propagation delay due to line resistance Rp and line capacitance Cp of first interconnection line 20a can be effectively utilized to suppress variation in signal delay among the decoders. Thus, an actual decoding operation (an operation of decoding a determined address bit) can be performed at a faster timing.

Figure 7:
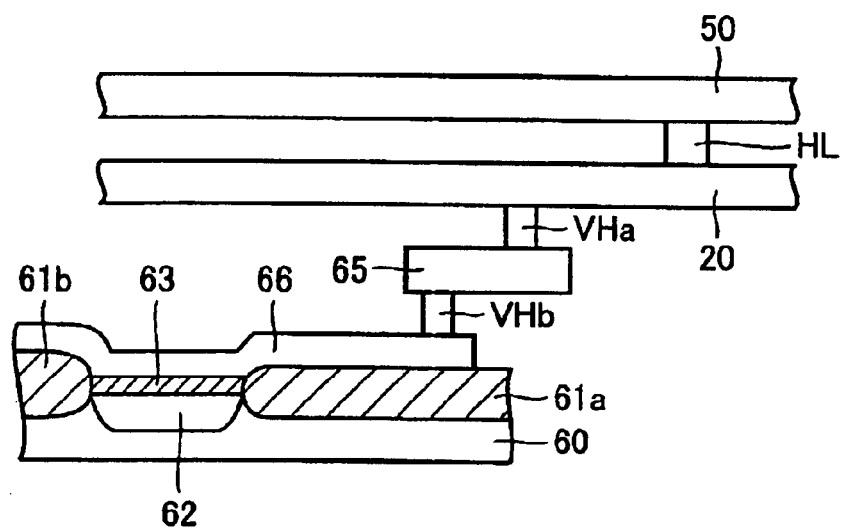
FIG. 7 schematically shows a cross-sectional structure of the interconnection layout shown in FIG. 5.

FIG. 7 schematically shows a cross-sectional structure of an arrangement of the interconnection lines in the first embodiment of the present invention. In FIG. 7, an active region 62 is formed at a surface of a semiconductor substrate region 60. Active region 62 corresponds to active region 23 or 25 shown in FIG. 5, and has the region defined by field insulation films 61a and 61b formed on semiconductor substrate region 60. A gate electrode interconnection line 66 is formed on active region 62 with a gate insulation film 63 interposed in between. Gate electrode interconnection line 66 corresponds to any of gate electrode interconnection lines 40 to 43 shown in FIG. 5, and extends onto field insulation films 61a and 61b formed outside active region 62. Gate electrode interconnection line 66 is electrically connected to an internal interconnection line 65 by a conductive member of a via hole VHb. Internal interconnection line 65 corresponds to internal interconnection line 30 or 31 shown in FIG. 5.

Internal interconnection line 65 is further electrically connected to first interconnection line 20 via a conductive member formed in a via hole VHa. First interconnection line 20 is electrically connected to second interconnection line 50 via through hole HL. First interconnection line 20 and second interconnection line 50 are arranged in parallel. The cross-sectional structure shown in FIG. 7 is only a schematic arrangement structure of the interconnection lines shown in FIG. 5, and corresponds to a cross-sectional structure of a portion including, for example, gate electrode interconnection line 40, internal interconnection line 30, via hole VH1, through hole HL1, and through hole HLa in the layout shown in FIG. 5.

Thus, in the cross-sectional structure shown in FIG. 7, interconnection lines corresponding to internal interconnection line 31 and an internal interconnection line transmitting ground voltage GND (internal interconnection 32 in FIG. 4) are separately provided in the same interconnection layer as internal interconnection line 65, as shown in FIG. 5. In FIG. 7, however, internal interconnection line 3 land ground line (GND) are not shown, in order to show the interconnection structure.

An internal interconnection line transmitting power supply voltage VCC and an internal interconnection line corresponding to output line OL of the NAND gate are shown in FIG. 5. By forming the interconnection lines transmitting address bit Ai into a multi-layer structure, address bit Ai can quickly be changed, and output line OL of the decoder (NAND gate NG) can be set to ground voltage GND level or power supply voltage VCC level at a faster timing.

In the description above, the decoder is formed using a NAND gate and an inverter receiving an output signal the NAND gate. The decoder, however, may be formed with the NAND gate alone, and the inverter may be used as a word line driver for driving a corresponding word line. Therefore, the structure of the decoder is not limited to the structure shown in FIG. 1. The present invention can be applied to any circuit that decodes a set of address bits and generates a signal indicating the decoding result.

As described above, according to the first embodiment of the present invention, the interconnection lines transmitting the address bits are each formed into a multi-layer structure of the first interconnection line connecting to the decoders and the second interconnection line transferring the address bit, and the first and second interconnection lines are electrically connected at a prescribed position. Thus, the address bit can be transferred to the distal end of the first interconnection line at high speed, and accordingly, a variation in difference in address bit arrival time among the decoders can be reduced.

In addition, address signal lines are formed into a multi-layer structure, and interconnection lines of a multi-layer interconnection are arranged overlapping with each other in a two-dimensional layout. Thus, an increase in interconnection layout area can be suppressed.

In addition, by forming all of interconnection lines of the multi-layer structure with the metal interconnection lines of the same material, it is unnecessary to change the pitch condition of the lower layer interconnection according to the pitch condition of the upper layer interconnection. Thus, an increase in interconnection layout area can be suppressed.

Second Embodiment

Figure 8:
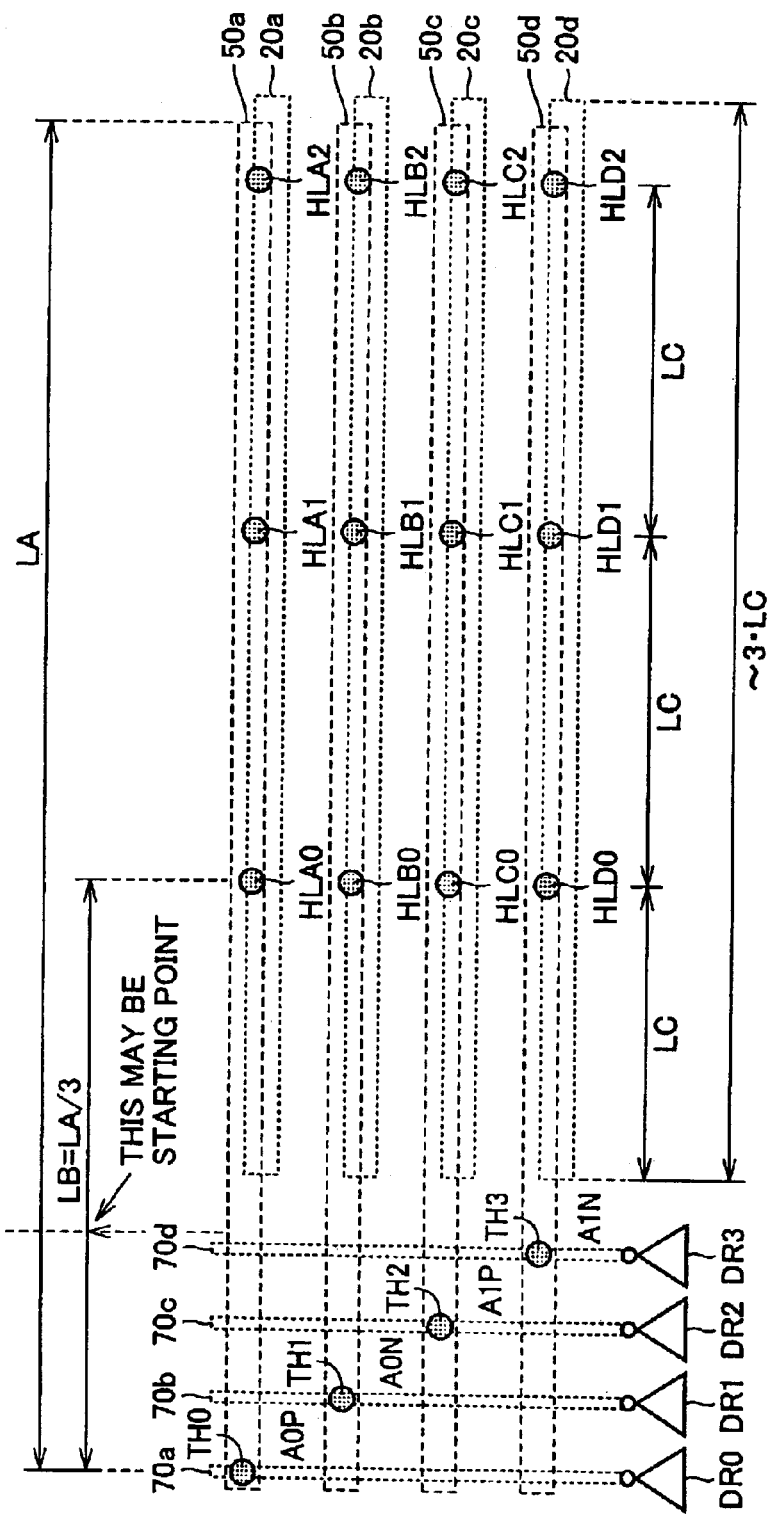
FIG. 8 schematically shows an interconnection layout according to a second embodiment of the present invention.

FIG. 8 schematically shows an interconnection layout according to a second embodiment of the present invention. In FIG. 8, second interconnection lines 50a to 50d are arranged, in an upper layer above first interconnection lines 20a to 20d, being aligned with first interconnection lines 20a to 20d. Second interconnection lines 50a to 50d are connected to address interconnection lines (third interconnection lines) 70a to 70d, extending in a vertical direction in the drawing, via through holes TH0 to TH3, respectively.

Address interconnection lines 70a to 70d are formed using first metal interconnection lines, for example, and are driven by drivers DR0 to DR3, respectively. Each of drivers DR0 to DR3 may be a buffer circuit included in address generation circuit 2 shown in FIG. 1, or may be a repeater arranged on an intermediate portion of address bus 3 shown in FIG. 1.

First interconnection line 20a and second interconnection line 50a are electrically connected by through holes HLA0 to HLA2 arranged with a prescribed spacing. Second interconnection line 50b is electrically connected to first interconnection line 20b via through holes HLB0 to HLB2 arranged in a prescribed spacing. First interconnection line 20c is electrically connected to second interconnection line 50c by through holes HLC0 to HLC2 arranged at a prescribed spacing. First interconnection line 20d is electrically connected to second interconnection line 50d by through holes HLD0 to HLD2 arranged at a prescribed spacing. Through holes HLA0 to HLA2, HLB0 to HLB2, HLC0 to HLC2, and HLD0 to HLD2 are respectively arranged on positions that divide first interconnection lines 20a to 20d into three sections. That is, when each of first interconnection lines 20a to 20d assumes about 3·LC in the whole length, through holes are arranged at an interval LC in each of first interconnection lines 20a to 20d.

Through holes HLA0 to HLD0 are arranged on positions at a distance LB from respective proximal ends of second interconnection lines 50a to 50d. Distance LB is one-third of a whole length LA of each of second interconnection lines 50a to 50d. Therefore, through holes HLA0 to HLA2 through HLD0 to HLD2 are arranged in a region extending, at the points distant by one-third times the whole length of the second interconnection line from proximal end portions (in which through holes TH0 to TH3 are provided) of second interconnection lines 50a to 50d, to the respective distal ends.

In FIG. 8, distance LB is measured with each tip of second interconnection lines 50a to 50d being the proximal end. Distance LB, however, may be measured regarding the positions, located outside a region in which address interconnection lines 70a to 70d are arranged, that is, positions adjacent to and on a right side of address interconnection 70d in the drawing, as the proximal ends of second interconnection lines 50a to 50d.

Figure 9:
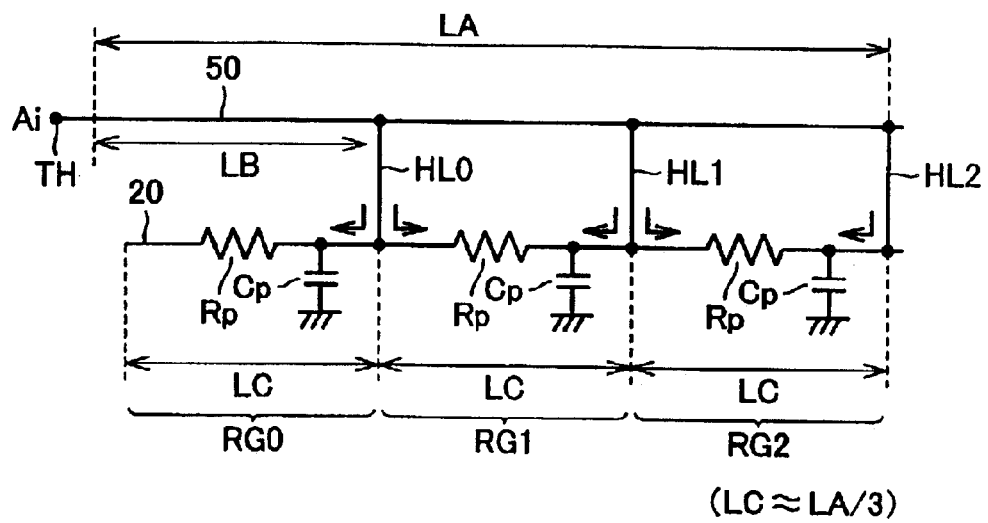
FIG. 9 schematically shows an electrical equivalent circuit of the interconnection layout shown in FIG. 8.

FIG. 9 schematically shows an electrical equivalent circuit of the interconnection layout shown in FIG. 8. In FIG. 9, single second interconnection line 50 and single first interconnection line 20 are representatively shown. First interconnection line 20 and second interconnection line 50 are electrically connected via each of through holes HL0, HL1 and HL2. Through holes HL0 and HL1 are arranged on positions that divide first interconnection line 20 into three equal portions, while through hole HL2 is arranged near the distal end of first interconnection line 20.

As shown in FIG. 8, a distance between through hole HL0 and the proximal end of second interconnection line 50 is LB, and the distance LB is one-third times the whole length (distance from the proximal end to the distal end) LA of the second interconnection line. The proximal end of second interconnection line 50 may be a tip thereof or a position outside an arrangement region for address lines. Therefore, in FIG. 9, the proximal end of second interconnection line 50 is indicated being arranged on an appropriate position on a right side of through hole TH for connection to the address line.

First interconnection line 20 has a whole length of 3·LC, and through holes HL0, HL1 and HL2 are arranged from the proximal end (a right tip) of first interconnection 20 at intervals LC.

Address bit Ai is transferred on second interconnection line 50. Address bit Ai is transmitted to second interconnection line 50 from a corresponding driver via through hole TH. The address bit transmitted over second interconnection line 50 is then transmitted to corresponding first interconnection line 20 via through holes HL0 to HL2.

First interconnection line 20 is divided into three regions RG0, RG1 and RG2, each having a length of about LC, by through holes HL0 and HL1. There are line resistance Rp and line capacitance Cp in each of regions RG0 to RG2 of first interconnection line 20. In region RG0, charges are supplied via through hole HL0 and parasitic capacitance Cp is charged. In region RG1, parasitic capacitance Cp is charged by the electric charges from through holes HL0 and HL1. Similarly, in region RG2, parasitic capacitance Cp is charged by the electric charges from through holes HL1 and HL2. With charging of parasitic capacitance Cp, a voltage level of first interconnection line 20 increases. Discharging of parasitic capacitance Cp is similarly performed via through holes HL0 to HL2.

In second interconnection line 50, address bit Ai is transmitted from through hole TH to through hole HL2 at the distal end. When there is a signal propagation delay in second interconnection line 50, a voltage level of second interconnection line 50 sequentially increases from through hole HL0 toward HL2. A current from through hole HL2 at the distal end, receiving the address bit the latest, is used to charge parasitic capacitance Cp in region RG2 and is not split into opposite directions. Therefore, the effect of the signal propagation delay in second interconnection line 50 is cancelled, and charging is performed at substantially the same speed in regions RG2 and RG1.

Regions RG0 and RG1 are charged at the same timing via through hole HL0. In region RG0, a current is simply supplied via through hole HL0. Parasitic capacitance Cp is a stray capacitance distributed over a corresponding interconnection portion. In addition, first interconnection line 20 is continuously extending, and regions RG0 and RG1 are the same in parasitic capacitance Cp and line resistance Rp, and therefore RC delay (time constant). Therefore, voltage distributions are made analogous in regions RG0 and RG1 (since amounts of split currents from through hole HL0 to regions RG0 and RG1 are adjusted in accordance with the voltage distributions), and parasitic capacitances Cps are charged at substantially the same speeds in regions RG0 and RG1 by the electric charges from through hole HL0. Thus, variation in voltage increase rate in regions RG0 to RG2 can be suppressed as compared with the case in which the proximal end (the side nearer to through hole TH) of first interconnection line 20 and second interconnection line 50 are connected via the through hole. Accordingly, a difference in the signal propagation delay between the proximal end and the distal end of first interconnection line 20 can re reduced, and a variation in decoding operation start timing of the decoders can be reduced.

Similarly, in the operation of discharging of parasitic capacitance Cp when address bit Ai falls, parasitic capacitances (stray capacitances) Cp are discharged at substantially the same speeds in regions RG0 to RG2.

In the layout shown in FIG. 8, as through holes TH0 to TH3 are distributed in the arrangement region of address interconnection lines 70a to 70d transmitting address bits from drivers DR0 to DR3, distances between through holes TH0 to TH3 and through holes HLA0 to HLD0 differ. By neglecting the signal propagation delays in second interconnection lines 50a to 50d in the arrangement region of signal lines 70a to 70d, however, the lining through holes to first interconnection lines 20a to 20d and second interconnection lines 50a to 50d can be arranged aligned in parallel.

In addition, due to displacement in position of the through holes TH0 to TH3 in the address line arranging region, the signal propagation delay may be generated differently for second interconnection lines 50a to 50d. However, if the split currents at through holes TH0 to TH3 are caused in opposite direction differently from each other, to cancel the difference in distance between through holes TH0 to TH3 and through holes HLA0 to HLA3, aligned arrangement of the through holes for connecting the first interconnection lines 20a to 20d to second interconnection lines 50a to 50d would cause no particular problem.

It is to be noted that the lining through holes for making electrical connections between first interconnection lines 20a to 20d and second interconnection lines 50a to 50d may be arranged being deviated from each other corresponding to the deviation of positions of through holes TH0 to TH3 for making electrical connection between address signal lines 70a to 70d and second interconnection lines 50a to 50d.

With any of the arrangements of the lining or backing through holes, and with the second interconnection line having the proximal end either at the tip thereof or at the position outside the address line arrangement region, the distribution of the signal propagation delay in the first interconnection lines can be suppressed, and accordingly, the difference in address bit arrival time to the decoders can be reduced.

In the arrangement shown in FIG. 8, an interval between through holes on first interconnection lines 20a to 20d is LC. Interval LC electrically (considering the signal propagation delay of the second interconnection lines described above) and substantially equals to the length LA/3 (=LB). Therefore, the distribution of the change timings of the address bits over the whole decoding circuit can be suppressed when the proximal end of second interconnection line 50 is set to either the tip thereof or in the region between the address line arrangement region and the tip portion of the first interconnection line.

In the arrangement shown in FIG. 8, lining through holes HL0 to HL2 are arranged in the region between the points distant ⅓ times the whole length LA from the proximal ends of second interconnection lines 50a to 50d and the distal ends of second interconnection lines 50a to 50d, to substantially divide each of first interconnection lines 20a to 20d into three equal portions. When M lining through holes are arranged in each of second interconnection lines 50a to 50d to substantially divide each of first interconnection lines 20a to 20d into M equal portions, the through holes between first interconnection lines 20a to 20d and second interconnection lines 50a to 50d are arranged at constant intervals between the points distant LA/M from the proximal ends of second interconnection lines 50a to 50d and the distal ends thereof.

Figure 10:
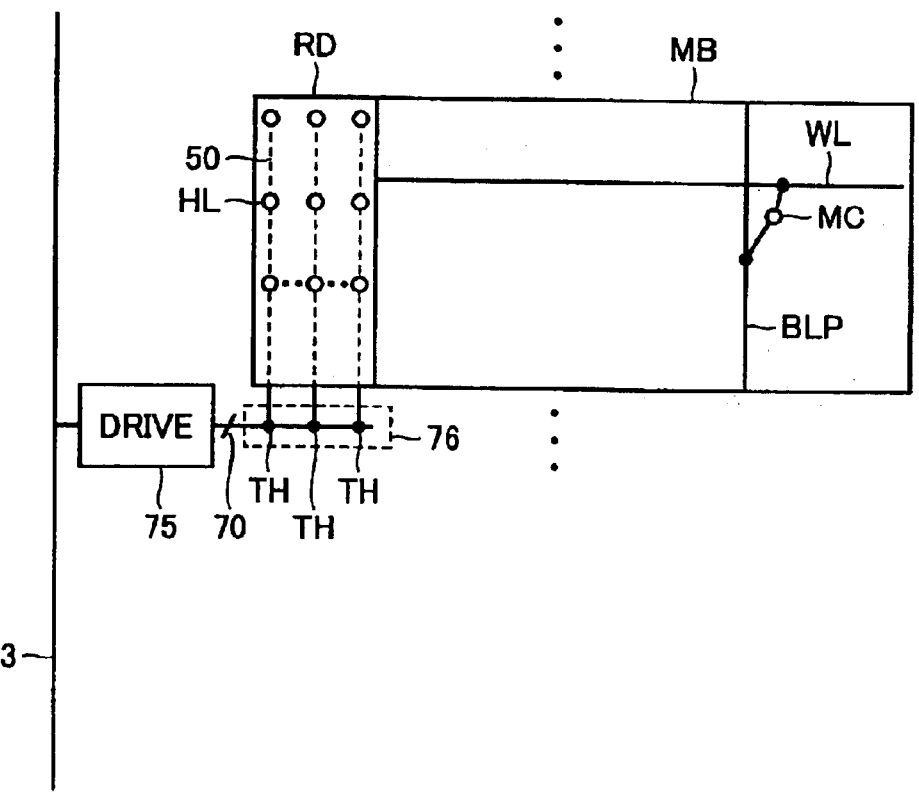
FIG. 10 shows an example of a specific application of the interconnection layout shown in FIG. 8.

FIG. 10 shows an example of a specific application of the interconnection layout according to the present invention. In FIG. 10, the address signal is used to specify a memory cell MC included in a memory block MB. In memory block MB, memory cells MCs are arranged in rows and columns, and a word line WL is arranged corresponding to a memory row and a bit line pair BLP is arranged corresponding to a memory cell column. One word line WL, one bit line pair BLP, and a memory cell MC arranged corresponding to a crossing portion these lines are shown in FIG. 10 representatively.

One memory array (memory mat) is formed by repeatedly arranging a plurality of memory blocks MBs along a column direction.

A row decoding circuit RD, which performs decoding and drives an addressed word line to a selected state, is provided corresponding to memory block MB. Second interconnection line 50 is arranged in row decoding circuit RD, and through holes HLs are arranged at a prescribed interval spacing on second interconnection line 50. The first interconnection line is arranged aligned with second interconnection 50 in a lower layer below second interconnection line 50. Second interconnection line 50 is arranged extending only within an arrangement region of corresponding row decoding circuit RD.

Row decoding circuit RD includes row decoders arranged corresponding to memory cell rows (word lines) of memory block MB, and the row decoders are coupled to corresponding first interconnection lines.

Second interconnection line 50 is coupled to a local address bus 70 including address interconnection lines 70a to 70d shown in FIG. 8 via through holes THs in an interconnection region 76. Local address bus 70 is coupled to address bus 3 via a drive circuit 75. Drive circuit 75 includes drivers DR0 to DR3 shown in FIG. 8. Drive circuit 75 and local address bus 70 correspond to branch node 4 shown in FIG. 1.

In the arrangement shown in FIG. 10, (main) address bus 3 is provided in common to a plurality of memory blocks MBs, the address signal is distributed to row decoding circuit RD arranged corresponding to each memory block MB by drive circuit 75, and local address bus 70 and second interconnection lines 50 are electrically connected via through holes HL in interconnection region 76. Thus, the load of (main) address bus 3 can be reduced, and the address signal can be transmitted to a plurality of memory blocks at high speed.

In addition, by forming the first interconnection lines and second interconnection lines into signal lines of a multi-layer structure in row decoding circuit RD, the address signal can be transmitted at high speed.

In the description above, the address signal is applied to row decoding circuit RD, and row decoding circuit RD decodes the address signal. A structure may be used, however, in which predecode signals of the address signal are applied to row decoding circuit RD, and the predecode signals are further decoded in row decoding circuit RD.

In addition, such a configuration may be employed that a block selection signal specifying a memory block may be applied to drive circuit 75 shown in FIG. 10 and drive circuit 75 drives local address bus 70 when the corresponding memory block is selected and driven to a selected state.

In addition, a column decoding circuit for generating a column selection signal may be used as a decoding circuit. Where the column decoding circuit is used, the column decoding circuit may be arranged in common to a plurality of memory blocks MBs, or the column decoding circuit may be arranged corresponding to each memory block when an internal data lines are arranged over the memory array as in an embedded DRAM. Further, the column decoding circuit may be configured to receive column predecode signals.

As described above, according to the second embodiment of the present invention, the through holes between the first interconnection line and the second interconnection line in an upper layer are formed in a region extending from a position distant at least a predetermined distance from the proximal end of the second interconnection line to the distal end of the second interconnection line. Therefore, the line capacitances and the stray capacitances between the through holes in the first interconnection line can be made highly uniform, and the variation in the signal arrival timing at the decoders performing decoding operations according to the signals of the first interconnection lines can be suppressed.

Third Embodiment

Figure 11:
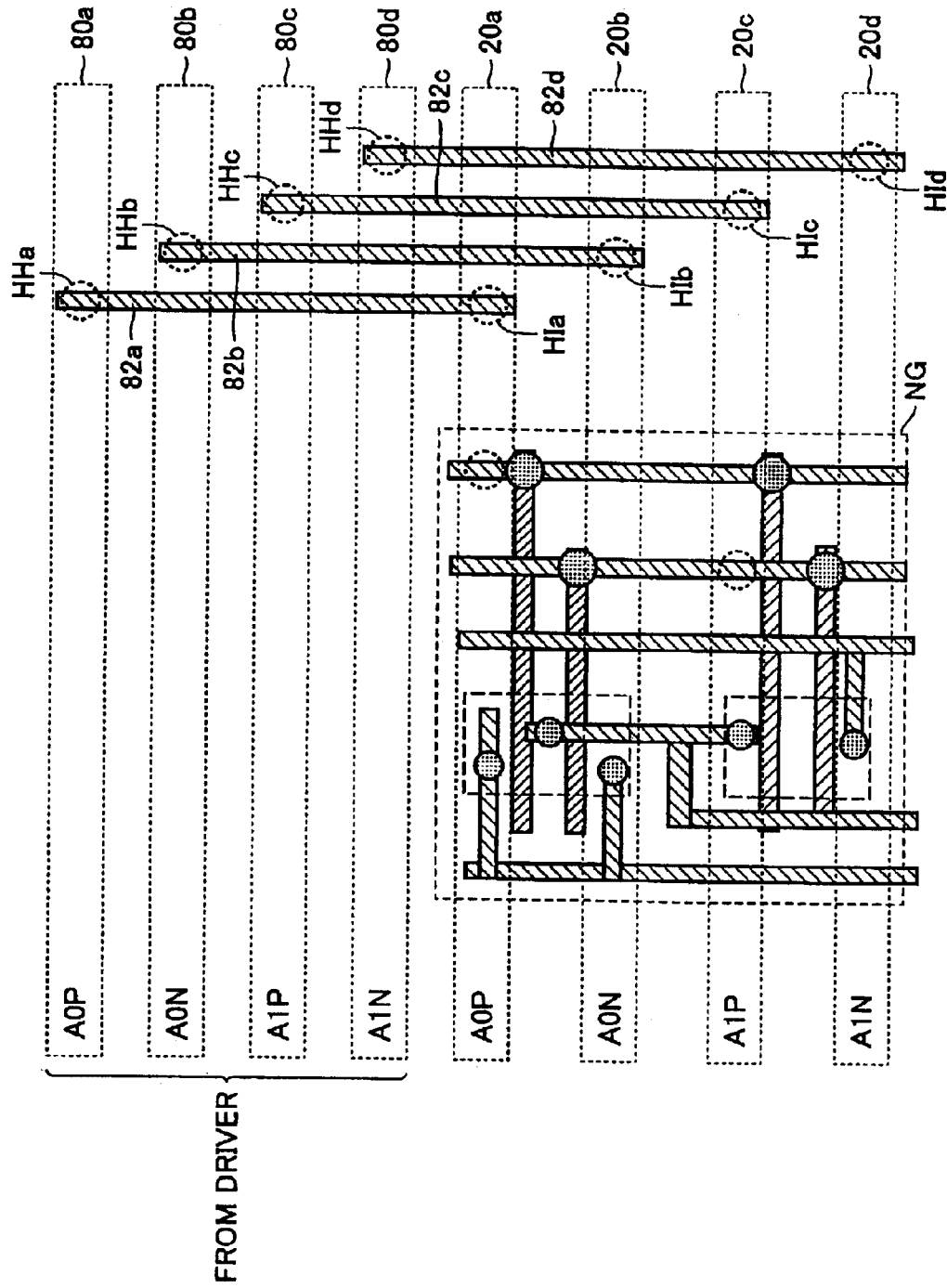
FIG. 11 schematically shows an interconnection layout of a semiconductor circuit device according to a third embodiment of the present invention.

FIG. 11 schematically shows an interconnection layout of a semiconductor circuit device according to a third embodiment of the present invention. In FIG. 11, as the layout shown in FIG. 4, first interconnection lines 20a to 20d are arranged linearly extending in a horizontal direction in the drawing. Address bits A0P, A0N, A1P, and A1N are transmitted to first interconnection lines 20a to 20d, respectively. As in the structure shown in FIG. 4, transistor formation regions are arranged in alignment in a horizontal direction in an arrangement region for first interconnection lines 20a to 20d, and transistors are formed in active regions to implement NAND gate NG. NAND gate NG shown in FIG. 11 has the same layout as NAND gate NG shown in FIG. 4. A decoder may be formed of NAND gate NG alone.

Second interconnection lines 80a to 80d are provided in the same interconnection layer as first interconnection lines 20a to 20d in parallel with first interconnection lines 20a to 20d. Address bits A0P, A0N, A1P, and A1N from drivers, not shown, are transmitted to second interconnection lines 80a to 80d, respectively.

First interconnection lines 20a to 20d are electrically connected to second interconnection lines 80a to 80d by respective connecting lines 82a to 82d via through holes HHa to HHd and HIa to HId. The connecting lines 82a to 82d are formed, for example, using second polysilicon interconnection lines.

In the arrangement shown in FIG. 11, second interconnection lines 80a to 80d and first interconnection lines 20a to 20d are arranged in the same interconnection layer in parallel with each other at different positions. Gate electrode interconnection lines of NAND gate NG are connected to first interconnection lines 20a to 20d. To second interconnection lines 80a to 80d, on the other hand, only connecting lines 82a to 82d are connected, respectively. Connecting lines 82a to 82d are sufficiently small in line resistance and line capacitance as compared with the gate electrode interconnection lines (a gate capacitance of a MIS transistor is connected to the gate electrode line). Therefore, second interconnection lines 80a to 80d are smaller in load than first interconnection lines 20a to 20d, and can transmit address bits A0P, A0N, A1P, and A1N at high speed. That is, in the arrangement shown in FIG. 11, second interconnection lines 80a to 80d provided on different positions in the same interconnection layer are utilized as lining interconnection lines for first interconnection lines 20a to 20d to equivalently reduce the load of first interconnection lines 20a to 20d.

The electrical equivalent circuit of the interconnection layout shown in FIG. 11 is the same as the electrical equivalent circuit of the multi-layer structure shown in FIG. 6. First interconnection lines 20a to 20d and second interconnection lines 80a to 80d are formed of conductive lines in the same layer. Second interconnection lines 80a to 80d, although being the same in line resistance, are sufficiently smaller in parasitic capacitance and parasitic resistance than first interconnection lines 20a to 20d, and can transmit address bits A0P, A0N, A1P, and A1N at high speed. Accordingly, the address bits can be transmitted to the decoder (NAND gate NG) connected to first interconnection lines 20a to 20d at high speed, and the signal propagation delay and the variation of the delays over the decoding circuit can sufficiently be suppressed.

As interconnection lines of the same layer are used as lining interconnection lines, the first and second interconnection lines can be formed through the same manufacturing steps, and increase in the number of the interconnection manufacturing steps can be suppressed. Connecting lines 80a to 80d are in the same layer as internal interconnection lines in the decoder, and the decoder internal interconnection lines and the connecting lines are formed through the same manufacturing steps.

In the third embodiment, the number of first interconnection lines 20a to 20d increases as the number of the address bits increases, and correspondingly, the number of second interconnection lines 80a to 80d also increases.

Here, the number of regions (lining regions) for interconnection of second interconnection lines 80a to 80d and first interconnection lines 20a to 20d is appropriately determined depending on an interconnection layout area of the decoding circuit and the signal propagation delay time.

As described above, according to the third embodiment of the present invention, by forming the second interconnection lines only transmitting the address bits in the same interconnection layer and electrically connecting the first and second interconnection lines at a prescribed interval, an interconnection line structure can be implemented which can transmit the address bits at high speed without increasing the number of the manufacturing steps, to suppress the signal propagation delay in the decoding circuit effectively.

Fourth Embodiment

Figure 12:
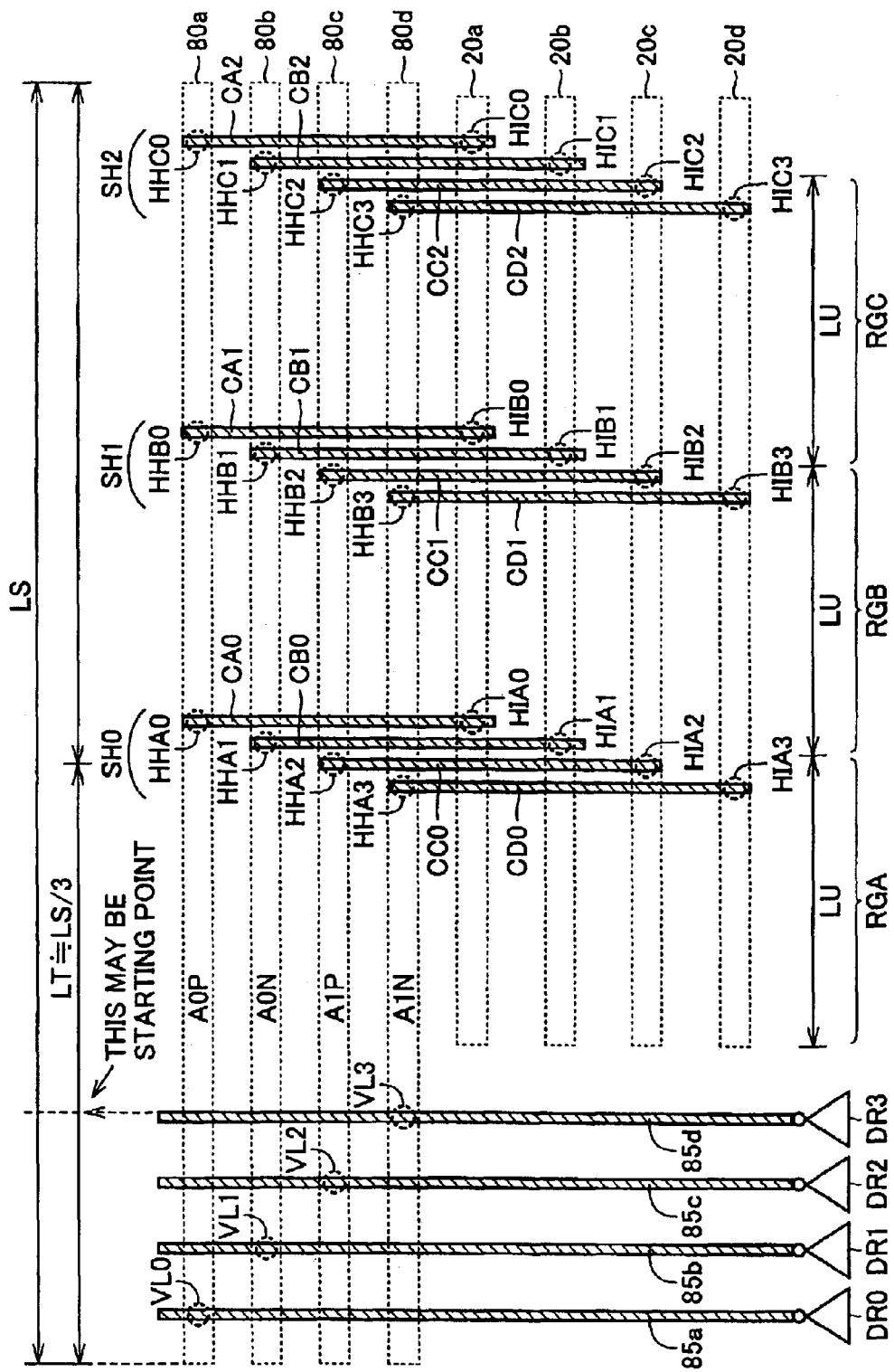
FIG. 12 schematically shows an interconnection layout of a semiconductor circuit device according to a fourth embodiment of the present invention.

FIG. 12 schematically shows a layout of a semiconductor circuit device according to a fourth embodiment of the present invention. In FIG. 12, first interconnection lines 20a to 20d are arranged linearly and continuously extending in a horizontal direction in the drawing. Decoders are connected to first interconnection lines 20a to 20d. A NAND gate included in the decoder has the same layout as NAND gate NG shown in FIG. 11. The decoder may be formed of the NAND gate alone.

Second interconnection lines 80a to 80d are arranged in parallel with first interconnection lines 20a to 20d in the same layer. Second interconnection lines 80a to 80d are connected respectively to address signal lines 85a to 85d by via holes VL0 to VL3. Address signal lines 85a to 85d are driven by drivers DR0 to DR3 respectively, and transmit address bits A0P, A0N, A1P, and A1N.

Lining regions SH0 to SH2 are provided to electrically connect first interconnection lines 20a to 20d and second interconnection lines 80a to 80d. In lining region SH0, first interconnection lines 20a to 20d are electrically connected with second interconnection lines 80a to 80d respectively by connecting lines CA0 to CD0. Connecting lines CA0 to CD0 are connected to second interconnection lines 80a to 80d respectively via through holes HH0 to HH3, and are also connected to first interconnection lines 20a to 20d via through holes HIA0 to HIA3, respectively.

In lining region SH1, second interconnection lines 80a to 80d are electrically connected to first interconnection lines 20a to 20d respectively via connecting lines CA1 to CD1. Connecting lines CA1 to CD1 are connected to second interconnection lines 80a to 80d, respectively via through holes HHB0 to HHB3, and are also connected to first interconnection lines 20a to 20d, respectively via through holes HIB0 to HIB3.

In lining region SH2, second interconnection lines 80a to 80d are electrically connected to first interconnection lines 20a to 20d respectively via connecting lines CA2 to CD2. Connecting lines CA2 to CD2 are electrically connected to second interconnection lines 80a to 80d via through holes HHC0 to HHC3, and are also electrically connected to first interconnection lines 20a to 20d via through holes HIC0 to HIC3, respectively.

By lining regions SH0 to SH2, each of first interconnection lines 20a to 20d is divided into regions RGA, RGB and RGC, each substantially having the length of LU.

Each of second interconnection lines 80a to 80d is LS in length from the proximal end to the distal end thereof. The first lining region SH0 is provided on a position at a distance LT from the proximal end of each of second interconnection lines 80a to 80d. Distance LT is at least ⅓ times the length LS. Lining regions SH0 to SH2 are arranged at a substantially constant interval, and each of first interconnection lines 20a to 20d are divided into three equal portions. Therefore, regions RGA, RGB and RGC in first interconnection lines 20a to 20d are the same in parasitic capacitance and parasitic resistance.

Address bits A0P, A0N, A1P, and A1N are transmitted to second interconnection lines 80a to 80d via drivers DR0 to DR3 and address signal lines 85a to 85d. Thus, the address bits are transmitted from the proximal ends to the distal ends of second interconnection lines 80a to 80d. Therefore, similarly to the layout shown in FIG. 8, distributions of the signal propagation delays in respective regions RGA to RGC can be made substantially the same in first interconnection lines 20a to 20d, and the variations in the signal propagation delay for respective decoders can be reduced.

Here, address signal lines 85a to 85d and connecting lines CA0 to CD0 through CA2 to CD2 are formed, for example, of second polysilicon interconnection lines in the same manufacturing steps as the decoder internal interconnection lines.

Lining internal interconnection lines may be arranged in respective lining regions SH0 to SH2 in the same order as connecting lines 82a to 82d shown in FIG. 11. Accordingly, distances between the through holes can be made uniform, and the variation in the signal propagation delay can be further reduced.

In the description above, the arrangement region of lining region SH0 is arranged distant LS/3 from the proximal ends of second interconnection lines 80a to 80d. The distance LS/3, however, may be measured relative to a portion in which address signal line 85d is arranged, that is, a portion near the aligning proximal ends of first interconnection lines 20a to 20d, as in the second embodiment. The setting of the proximal ends of second interconnection lines 80a to 80d and the signal propagation delays can be discussed, as in the second embodiment, as the signal propagation delay in each region of the first interconnection line. The variation in the signal propagation delay over the decoders can be suppressed as in the second embodiment with either setting of the proximal ends of the second interconnection lines.

In addition, when connecting lines CA0-CD0 to CA2-CD2 are arranged in the same order in lining regions SH0 to SH2, the intervals between through holes on first interconnection lines 20a to 20d becomes regular and constant, and RC time constants of the regions between the through holes can be made equal in first interconnection lines 20a to 20d.

In the arrangement shown in FIG. 12, three lining regions SH0 to SH2 are arranged. The number of lining regions, however, is not limited to three, and can appropriately be determined according to the amount of the signal propagation delay and a margin of the interconnection layout area. When each of first interconnection lines 20a to 20d is divided into M portions by the lining regions, the lining regions are arranged at a regular interval in a region extending from a position at a distance LT=LS/M from the proximal end of the second interconnection to the distal end thereof.

When interconnection lines in the same interconnection layer as the first interconnection lines are used as the lining interconnection lines for first interconnection lines 20a to 20d, similar operational effect as in the third embodiment are achieved, and the distribution of the signal propagation delays over decoders can be reduced.

The interconnection layout shown in FIG. 12 can also be applied to the specific structure shown in FIG. 10. It is also applicable to a column decoder selecting a column, in addition to the row decoding circuit.

As described above, according to the fourth embodiment of the present invention, the lining second interconnection lines, transmitting address signal bits, are arranged in parallel with and in the same interconnection layer as the first interconnection lines connected to the decoders, and the first and second interconnection lines are connected at a prescribed interval. In addition, the second interconnection line and the first interconnection lines are electrically connected in a region distant at least a prescribed distance from the proximal end of the second interconnection line. Therefore, as a signal is not transmitted from the proximal end of the first interconnection line, but is transmitted starting at a prescribed region, the variation in the signal propagation delay over the proximal to distal ends of the first interconnection line can be reduced.

Other Application Examples

In the description above, the address decoding circuit for decoding an address signal is discussed. The present invention, however, can be applied to a configuration in which predecode signals in place of the address signal bits are transmitted and the predecode signals are further decoded.

A layout of the decoder is also not limited to the layout shown in FIG. 4, and the decoder may have another layout.

Generally, the present invention can be applied to any circuitry having the same circuit structure repeatedly arranged, decoding a received signal of a plurality of bits, and selecting an operation mode or an element according to the decoding result.

In addition, the number of address bits are not limited to four bits and, generally, the signal may be a designation signal of N bits specifying a selection object.

As described above, according to the present invention, the second interconnection lines are connected at a prescribed spacing to the first interconnection lines connecting to a plurality of identical circuits (repetitive circuits), and necessary signals are transmitted to the first interconnection lines via the second interconnection lines. Therefore, the line capacitance and line resistance of the first interconnection line can equivalently be reduced, and accordingly, the signal propagation delay can be decreased and the variation in the signal propagation delay can be suppressed to generate the selection signal (decoding result signal) at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device generating an output signal according to a plurality of signals, comprising:
   a plurality of first interconnection lines arranged corresponding to said plurality of signals, respectively;
   a plurality of second interconnection lines arranged corresponding to and in parallel with said plurality of first interconnection lines, each second interconnection line being electrically connected to a corresponding first interconnection line at a prescribed position and transmitting a corresponding signal to the corresponding first interconnection; and
   a plurality of logic circuits formed in a lower layer region below the first interconnection lines, each logic circuits receiving a predetermined signal on said plurality of first interconnection lines and logically processing the received signal to generate an output signal.

2. The semiconductor circuit device according to claim 1, wherein
   each of the first and second interconnection lines is linearly arranged and has a first end, a second end, and a first point between the first and second ends,
   said prescribed position comprises a position between the first point and said second end, and the first point, and
   said plurality of signals are each transferred in the second interconnection lines from said first end toward said second end, and a distance between said first end and said first point is shorter than a distance between said first point and said second end.

3. The semiconductor circuit device according to claim 2, wherein
   said prescribed position includes said first point, said second end and the position between said first point and said second end, and
   said first point is at a distance of ⅓ times the distance between said first end and said second end from said first end.

4. The semiconductor circuit device according to claim 2, further comprising:
   a drive circuit for generating said plurality of signals; and
   a plurality of third interconnection lines arranged, corresponding to the respective second interconnection lines in a direction intersecting with the second interconnection lines, each transferring a corresponding signal from a corresponding drive circuit, each third interconnection line being electrically connected to a corresponding second interconnection line in a region corresponding to the first end.

5. The semiconductor circuit device according to claim 1, further comprising a drive circuit for generating said plurality of signals, wherein
   the second interconnection lines are arranged in a region different from the first interconnection lines and are each formed using an interconnection line in a same interconnection layer as the first interconnection lines to transfer a corresponding signal from said drive circuit.

6. The semiconductor circuit device according to claim 1, further comprising a drive circuit for generating said plurality of signals, wherein
   the second interconnection lines are arranged in an upper layer over a corresponding first interconnection line so as to overlap with the corresponding first interconnection line in a two dimensional layout, and transferring a signal from said drive circuit.

* * * * *